(12) United States Patent
Oh

(10) Patent No.: US 8,168,517 B2
(45) Date of Patent: May 1, 2012

(54) METHOD FOR EPITAXIAL GROWTH AND EPITAXIAL LAYER STRUCTURE USING THE METHOD

(75) Inventor: Jae-eung Oh, Ansan (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 70 days.

(21) Appl. No.: 12/388,643

(22) Filed: Feb. 19, 2009

(65) Prior Publication Data
US 2010/0187499 A1 Jul. 29, 2010

(30) Foreign Application Priority Data
Jan. 29, 2009 (KR) .......................... 10-2009-0007042

(51) Int. Cl.
H01L 21/20 (2006.01)
H01L 21/36 (2006.01)
(52) U.S. Cl. ................................. 438/493; 257/E21.09
(58) Field of Classification Search .................... 438/41, 438/493; 257/14, E21.09
See application file for complete search history.

(56) References Cited

U.S. PATENT DOCUMENTS

| | | | |
|---|---|---|---|
| 5,290,393 A | | 3/1994 | Nakamura |
| 6,265,289 B1 | | 7/2001 | Zheleva et al. |
| 7,432,175 B2 * | | 10/2008 | Huffaker et al. ............. 438/479 |
| 7,554,109 B2 * | | 6/2009 | Stokes et al. .................... 257/17 |
| 2002/0030246 A1 | | 3/2002 | Eisenbeiser et al. |
| 2002/0119680 A1 * | | 8/2002 | Wang et al. ................... 438/962 |
| 2004/0094084 A1 * | | 5/2004 | Ouchi et al. ...................... 117/2 |
| 2008/0206966 A1 * | | 8/2008 | Huffaker et al. .............. 438/479 |

FOREIGN PATENT DOCUMENTS
KR 10-0833897 B1 5/2008
KR 833897 B1 * 6/2008

OTHER PUBLICATIONS

Fischer and H. Morkoc, D.A. Neumann and H. Zabel, Choi and N, Otsuka and Longerbone and L. P.Erickson, Material properties of high-quality GaAs epitaxial layers grownon Sisubstrates, 1986 American Institute of Physics, Sep. 1, 1986, J. Appl. Phys. 60, 1640-1647.

(Continued)

*Primary Examiner* — William D Coleman
*Assistant Examiner* — Christine Enad
(74) *Attorney, Agent, or Firm* — Kile Park Goekijian Reed & McManus PLLC

(57) ABSTRACT

There are provided a method for epitaxial growth capable of securing stable optical and electrical characteristics by minimizing defects produced in a second epitaxial layer when growing the second epitaxial layer on a first epitaxial layer having defects formed therein, and an epitaxial layer structure using the method. The method includes preparing a first epitaxial layer having a defect formed therein, forming a metal quantum dot on the first epitaxial layer, allowing the metal quantum dot to be moved onto a step of the first epitaxial layer due to a difference of surface energy, converting the metal quantum dot into a metal quantum-dot semiconductor crystal having a lattice constant corresponding to that of the first epitaxial layer, and growing a second epitaxial layer on the first epitaxial layer.

11 Claims, 7 Drawing Sheets

OTHER PUBLICATIONS

S.M.Bedair, El-Masry, Y. Lo, N.Hamaguchi, C.D. Lamp, A.A. Tuttle, D.L. Dreifus and P. Russel, Defect reduction in GaAs grown by molecular beam epitaxy using different superlattice structures, 1986 American Institute of Physics, Oct. 13, 1986, Appl. Phys. Lett 49, 942-944.

Masayoshi Umeno, Tetsuo Soga, Krishnan Baskar and Takashi Jimbo, Heteroepitaxial technologies on Si for high-efficiency solar cells, Solar Energy Materials and Solar Cells 50, 1998, 203-212.

T.Lei, M. Fanciulli, R.J. Molnar, T.D. Moustakas, R.J. Graham, J.Scanlon, Epitaxial growth of zinc blende and wurtizitic gallium nitride thin films on(001) silicon, 1991 American Institute of Physics, Aug. 19, 1991, Appl. Phys. Lett. 59(8), 944-946.

Tanemasa Asano, Hiroshi Ishiwara, Hee Chul Lee, Kazuo Tsutsui and Seijiro Furukawa, Formation of GaAs-on-Insulator Structures on Si Substrates by Heteroepitaxial Growth of CaF2 and GaAs, Japanes Journal of Applied Physics, Feb. 1986, L139-L141, vol. 25, No. 2.

Tanemasa Asano, Hiroshi Ishiwara and Noriyuki Kaifu, Heteroepitaxial Growth of Group-IIa-Fluoride Films on Si Substrates, Japanes Journal of Applied Physics, Oct. 1983, 1474-1481, vol. 22, No. 10.

* cited by examiner

- EPITAXIAL LAYER HAVING HIGH LATTICE DEFECT DENSITY
- EPITAXIAL LAYER HAVING REDUCED LATTICE DEFECT
- LATTICE DEFECT
- SUPERLATTICE LAYER
- SUBSTRATE

METHOD FOR EPITAXIAL GROWTH AND EPITAXIAL LAYER STRUCTURE USING THE METHOD

CROSS-REFERENCE TO RELATED APPLICATION

This application claims priority to Korean Patent Application No. 2009-7042, filed on Jan. 29, 2009 and all the benefits accruing therefrom under 35 U.S.C. §119, the contents of which in its entirety are herein incorporated by reference.

BACKGROUND

1. Field

This disclosure relates to a method for epitaxial growth and an epitaxial layer structure using the method. More particularly, this disclosure relates to a method for epitaxial growth capable of securing stable optical and electrical characteristics by minimizing defects produced in a second epitaxial layer when growing the second epitaxial layer on a first epitaxial layer having defects formed therein, and an epitaxial layer structure using the method.

2. Description of the Related Art

Epitaxial growth refers to a process of forming a new monocrystalline layer on a monocrystalline substrate. The new monocrystalline layer formed by the epitaxial growth is referred to as an epitaxial layer. In the epitaxial growth, the monocrystalline substrate and the epitaxial layer may be formed of the same material (homoepitaxy) or of different materials (heteroepitaxy). In both cases, the lattice constant of the monocrystalline substrate needs to be identical or similar to that of the epitaxial layer.

When a material having a different lattice constant from that of a monocrystalline substrate is grown as an epitaxial layer to have a critical thickness or thicker, defects such as dislocation or micro-twin are inevitably produced in the corresponding epitaxial layer. Such a defect in the epitaxial layer is transferred to a thin film formed on the epitaxial layer, thereby deteriorating optical and electrical characteristics of the entire device. When the lattice constant of the monocrystalline substrate is identical to that of the epitaxial layer, subsequent epitaxial growth is also influenced by an inferior surface of the monocrystalline substrate, and therefore, a defect is induced in subsequent epitaxial growth.

Accordingly, studies have recently been conducted to remove defects produced in an epitaxial layer or to minimize the density of defects. Representative methods are as follows: a method of preventing defects from being transferred to a subsequent layer by laminating different semiconductor layers to change transfer directions of the defects (see FIG. 1); a method of preventing defects from being transferred by interposing an epitaxial layer at low temperature (see FIG. 2); a Pendeo epitaxy or epitaxial lateral overgrowth (ELOG) method of preventing defects from being partially transferred using a metal or other material and forming a high-quality epitaxial layer using lateral growth of a growth layer (see FIG. 3); and a method of preventing defects from being transferred by interposing a material layer having crystal structure and lattice constant similar to those of an epitaxial layer between a substrate and the epitaxial layer (see FIG. 4).

The methods of preventing transfer of defects according to related arts will be described in detail. First, the method of reducing the density of defects using a superlattice layer, shown in FIG. 1, is a method of reducing the Burgers vector of dislocation by applying strain or by changing the composition of a material. As long as the density of lattice defects is very low, it is known that the method is effective to a certain degree. However, if the density of the lattice defects is high or if a degree of the lattice defects is great, it is known that the effect and reproducibility of the method are degraded. The method of preventing transfer of defects using a superlattice layer has been disclosed in Erickson et al., *J. Appl. Phys.* 60, 1640 (1986), Russell et al., *Appl. Phys. Lett.* 49, 942 (1986), Umeno et al., *Sol. Energ. Mat. Sol. C.* 50, 203 (1998), and the like.

Next, the method of reducing lattice defects using a low-temperature buffer layer, shown in FIG. 2, is a method of preventing transfer of dislocations by interposing a thin buffer layer between a substrate and an epitaxial layer at low temperature. Although a clear mechanism has not been elucidated, it is known that a high-quality epitaxial layer is formed through a combination of some materials. Further, it is known that a kind of seed layer having a polycrystalline shape is formed through low-temperature growth, and a monocrystalline layer is then formed on the seed layer. Furthermore, it is known that the method is effective when a low-temperature GaN or AlN seed layer is formed on sapphire ($Al_2O_3$) and an epitaxial layer is then formed on the seed layer or when InSb is formed on a GaAs substrate. The method has been disclosed in U.S. Pat. No. 5,290,393 (Crystal growth method for gallium nitride-based compound semiconductor), and the like.

Next, the Pendeo epitaxy or ELOG method shown in FIG. 3 is a method of reducing lattice defects in a GaN light emitting device or the like. In the method, transfer of lattice defects is prevented using SiN, a metal, or the like, and growth of an epitaxial layer is induced in directions except for the direction perpendicular to a substrate, thereby minimizing lattice defects. However, an additional multistep process is required, and it is difficult to manufacture a device having uniform characteristics, because the device is divided into portions with no defect and portions with defects. The Pendeo epitaxy method has been disclosed in U.S. Pat. No. 6,265,289 (Methods of fabricating gallium nitride semiconductor layers by lateral growth from sidewalls into trenches, and gallium nitride semiconductor structure fabricated thereby), Lei et al., *Appl. Phys. Lett.* 59(8), 944 (1991), and the like.

Finally, the method of preventing lattice defects using a buffer layer having a similar lattice constant to an epitaxial layer, shown in FIG. 4, is a method of growing a GaAs or InP epitaxial layer on a silicon monocrystalline substrate without a defect, which has been developed by Motorola, Inc., and the like. In the method, a buffer layer having the crystal structure and lattice constant similar to those of an epitaxial layer is formed on a substrate, and the epitaxial layer is then grown on the buffer layer, thereby preventing lattice defects. In case of GaAs on Si, very excellent results have been reported by Motorola and the like. However, when the diameter of a substrate is great, cracks are produced in an epitaxial layer due to the difference of thermal expansion coefficient between respective layers. Therefore, reliability and reproductivity are degraded. Further, a separate deposition equipment is used to form a buffer layer, and therefore, efficiency is lowered. The method of preventing lattice defects using a buffer layer has been disclosed in Ishiwara et al., *Jpn. J. Appl. Phys.* 25, L139 (1986), Ishiwara et al., *Jpn. J. Appl. Phys.* 22, 1476 (1983), U.S. Patent Publication No. 2002/0030246 (Structure and method for fabricating semiconductor structures and devices not lattice matched to the substrate), and the like.

As described above, in the methods of preventing transfer of defects according to the related arts, defects in an epitaxial layer are minimized by forming a separate thin film such as a superlattice layer or buffer layer, or by using a separate deposition equipment. Therefore, processing is complicated and processing efficiency is lowered.

Meanwhile, the applicant has disclosed, in Korean Patent Registration No. 833897, a method in which quantum dots are formed on a first epitaxial layer, and defects are repaired by the quantum dots. However, complementary measures are required to increase defect repair efficiency.

SUMMARY

This disclosure provides a method for epitaxial growth capable of securing stable optical and electrical characteristics by minimizing defects produced in a second epitaxial layer when growing the second epitaxial layer on a first epitaxial layer having defects formed therein, and an epitaxial layer structure using the method.

In one aspect, there is provided a method for epitaxial growth, which includes preparing a first epitaxial layer having a defect formed therein; forming a metal quantum dot on the first epitaxial layer; allowing the metal quantum dot to be moved onto a step of the first epitaxial layer due to a difference of surface energy; converting the metal quantum dot into a metal quantum-dot semiconductor crystal having a lattice constant corresponding to that of the first epitaxial layer; and growing a second epitaxial layer on the first epitaxial layer.

In the fourth operation, the metal quantum dot may be converted into the metal quantum-dot semiconductor crystal by allowing the metal quantum dot to react with the first epitaxial layer or by allowing the metal quantum dot to react with a reactant. The reactant may be a group V or VI anion of a material constituting the first epitaxial layer. The second epitaxial layer may have a lattice constant corresponding to that of the first epitaxial layer. The mismatch of lattice constants between the first and second epitaxial layers may be within 10%.

The first epitaxial layer may be a substrate, and the substrate may be any one of a silicon monocrystalline substrate, a silicon polycrystalline substrate, a germanium monocrystalline substrate, a GaAs monocrystalline substrate, an InAs monocrystalline substrate, a GaN monocrystalline substrate and a sapphire monocrystalline substrate. The first and second epitaxial layers may be made of a binary compound semiconductor including any one of GaAs, AlAs, InAs, GaSb, AlSb, InSb, GaN, AlN, InN, GaP, AlP, InP, ZnO and MgO, a tertiary compound semiconductor or a quaternary compound semiconductor, or may be formed into a structure in which at least two of the tertiary or quaternary compound semiconductors are stacked.

In another aspect, there is provided an epitaxial layer structure including a first epitaxial layer having a defect formed therein; a metal quantum-dot semiconductor crystal positioned on a step of the first epitaxial layer, the metal quantum-dot semiconductor crystal having a lattice constant corresponding to that of the first epitaxial layer; and a second epitaxial layer formed on the first epitaxial layer, the second epitaxial layer having a lattice constant corresponding to that of the first epitaxial layer.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Figure 1:
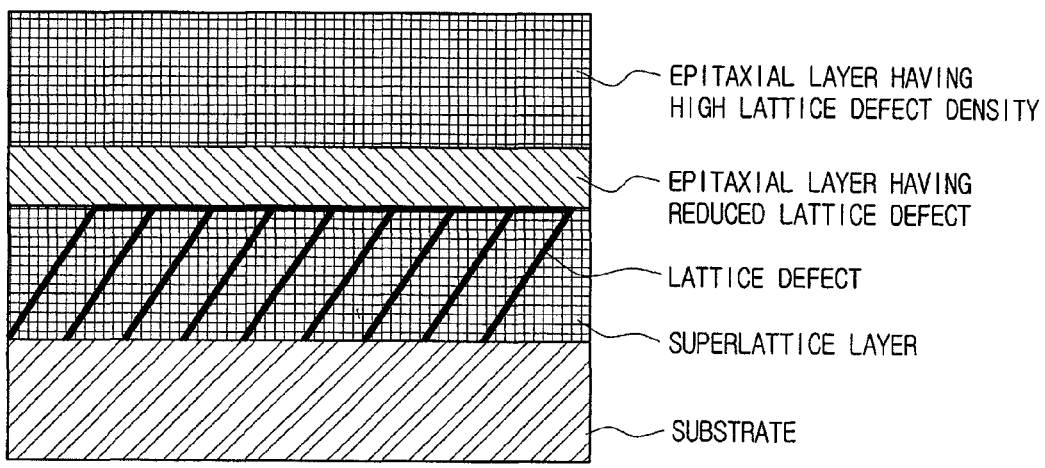
FIGS. 1 to 4 are reference diagrams illustrating methods for preventing defect transfers according to related arts.
Figure 2:
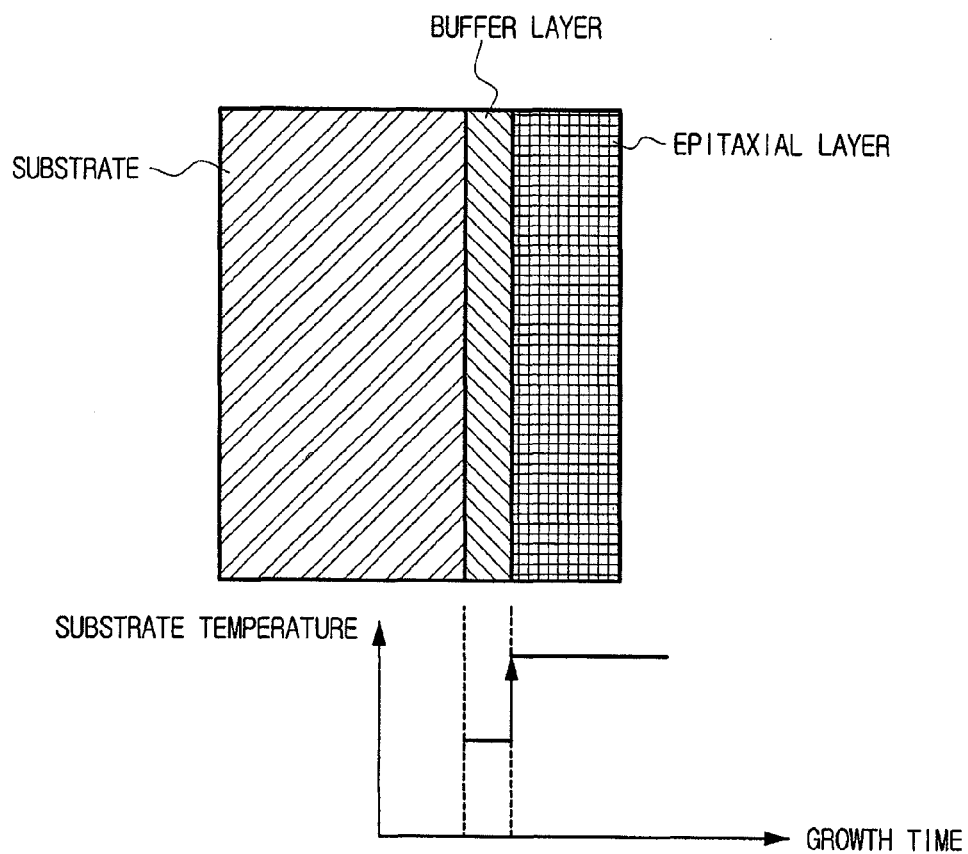
Figure 3:
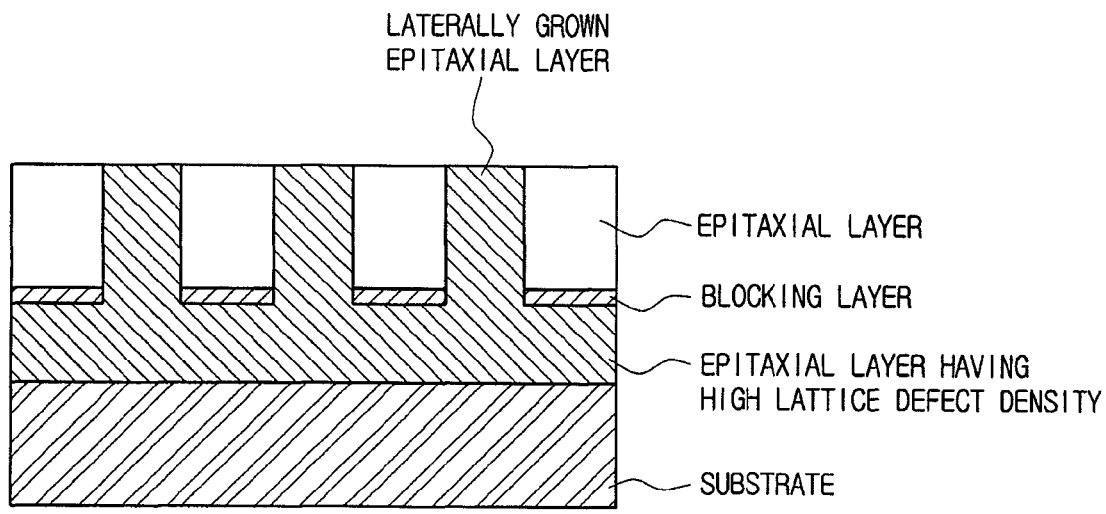
Figure 4:
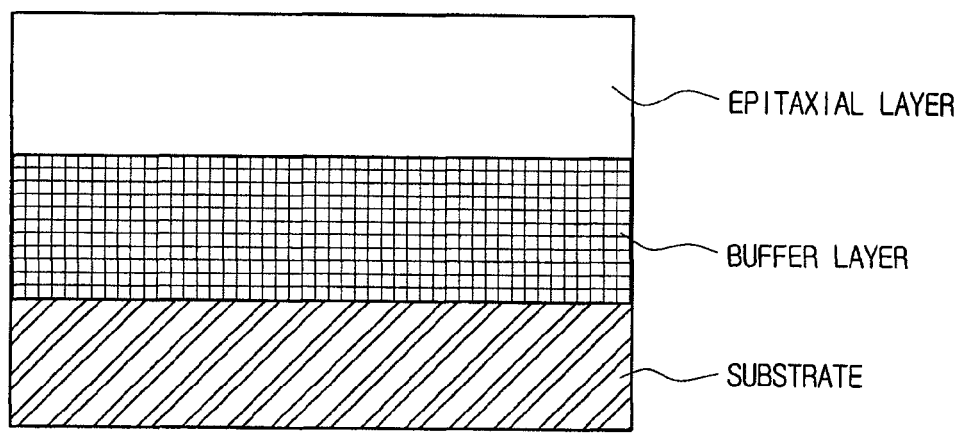

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

The entire process in a method for epitaxial growth disclosed herein is to grow a second epitaxial layer on a first epitaxial layer having defects formed therein, wherein the transfer of the defects to the second epitaxial layer is minimized. The transfer of the defect is prevented by metal quantum-dot semiconductor crystals formed on the first epitaxial layer. A quantum-dot forming material and the first epitaxial layer are sufficiently lattice-matched to each other. Here, the first epitaxial layer may be a substrate.

The defects in the first epitaxial layer are lattice defects such as dislocations or micro twins. To remove or minimize the lattice defect, metal quantum dots are formed on the first epitaxial layer, and a corresponding metal quantum dot is moved onto a defect formed in the first epitaxial layer. Then, metal quantum-dot semiconductor crystals are formed by allowing the metal quantum dot to react with the first epitaxial layer or a reactant, so that the defect may be repaired. Accordingly, the transfer of that the defect the second epitaxial layer formed on the first epitaxial layer is prevented.

Hereinafter, a method for epitaxial growth according to an embodiment will be described in detail with reference to the accompanying drawings.

Figure 5:
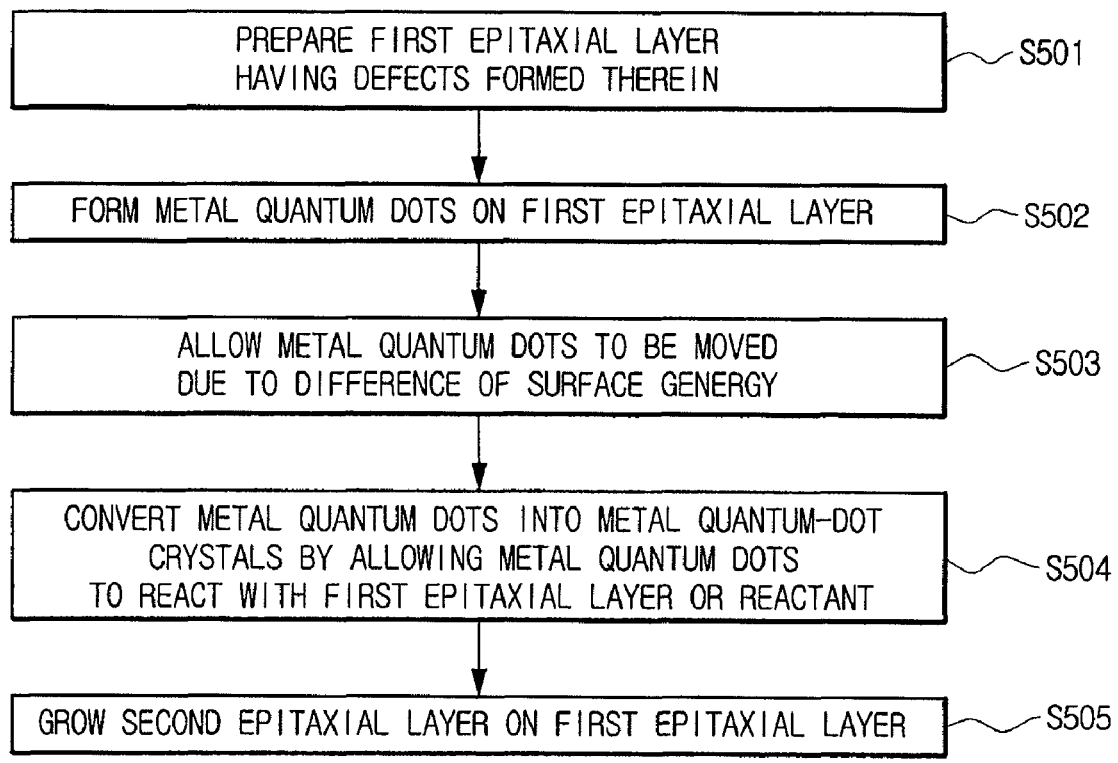
FIG. 5 is a flowchart illustrating a method for epitaxial growth according to an embodiment.
Figure 6:
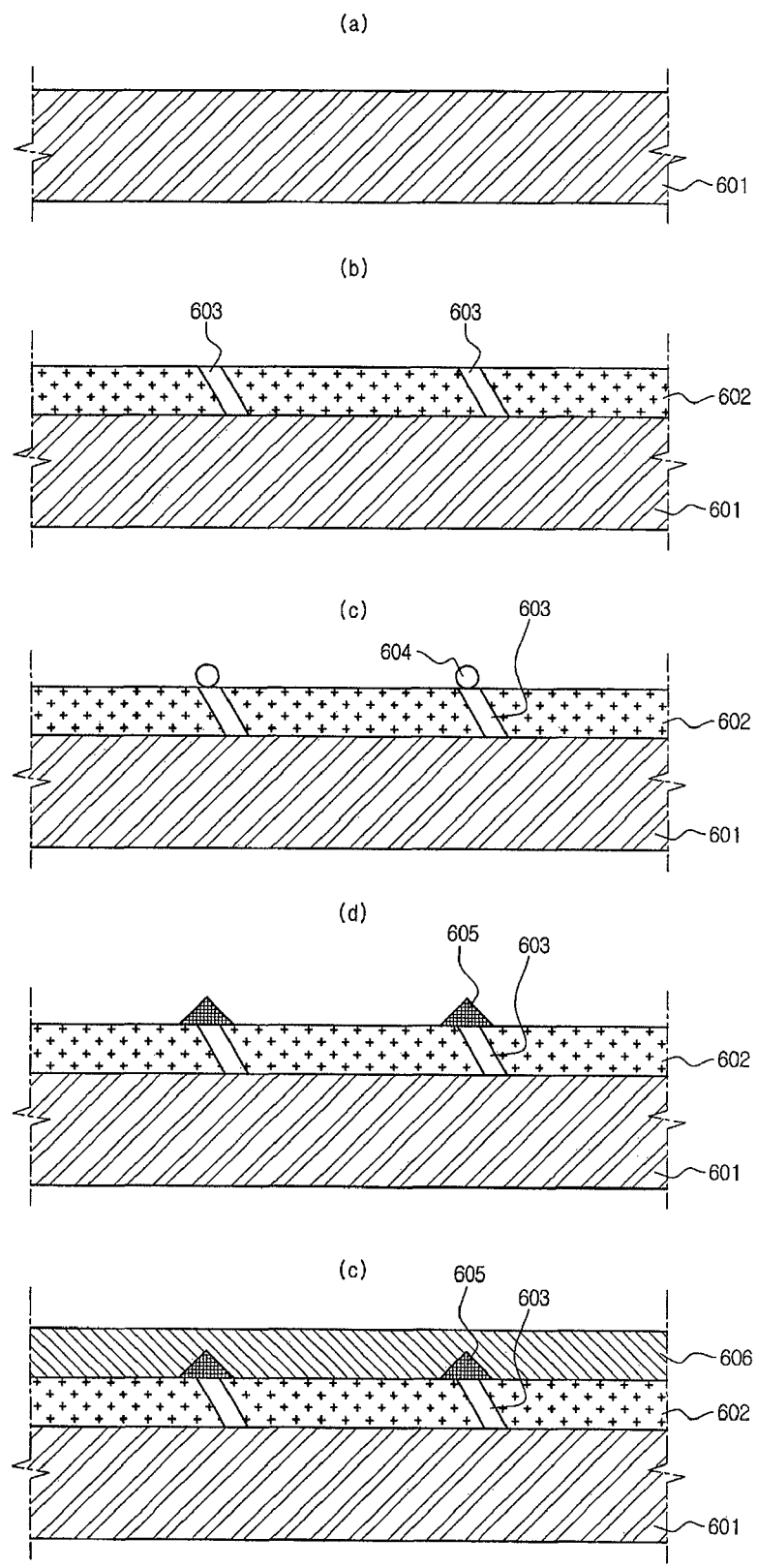
FIG. 6 shows cross-sectional views sequentially illustrating the method for epitaxial growth according to the embodiment.

FIG. 5 is a flowchart illustrating a method for epitaxial growth according to an embodiment. FIG. 6 shows cross-sectional views sequentially illustrating the method for epitaxial growth according to the embodiment.

As shown in FIG. 5 and (a) of FIG. 6, a first epitaxial layer 602 having defects formed therein is first prepared (S501). The first epitaxial layer 602 may be formed on a substrate 601, or the first epitaxial layer 602 itself may be a substrate. Hereinafter, description will be made for the case where the first epitaxial layer 602 is formed on a substrate 601. The first epitaxial layer 602 may be made of a binary compound semiconductor including any one of GaAs, AlAs, InAs, GaSb, AlSb, InSb, GaN, AlN, InN, GaP, AlP, InP, ZnO and MgO, a tertiary compound semiconductor or a quaternary compound semiconductor. Alternatively, the first epitaxial layer 202 may be formed into a structure in which at least two of the tertiary or quaternary compound semiconductors are stacked.

Figure 8:
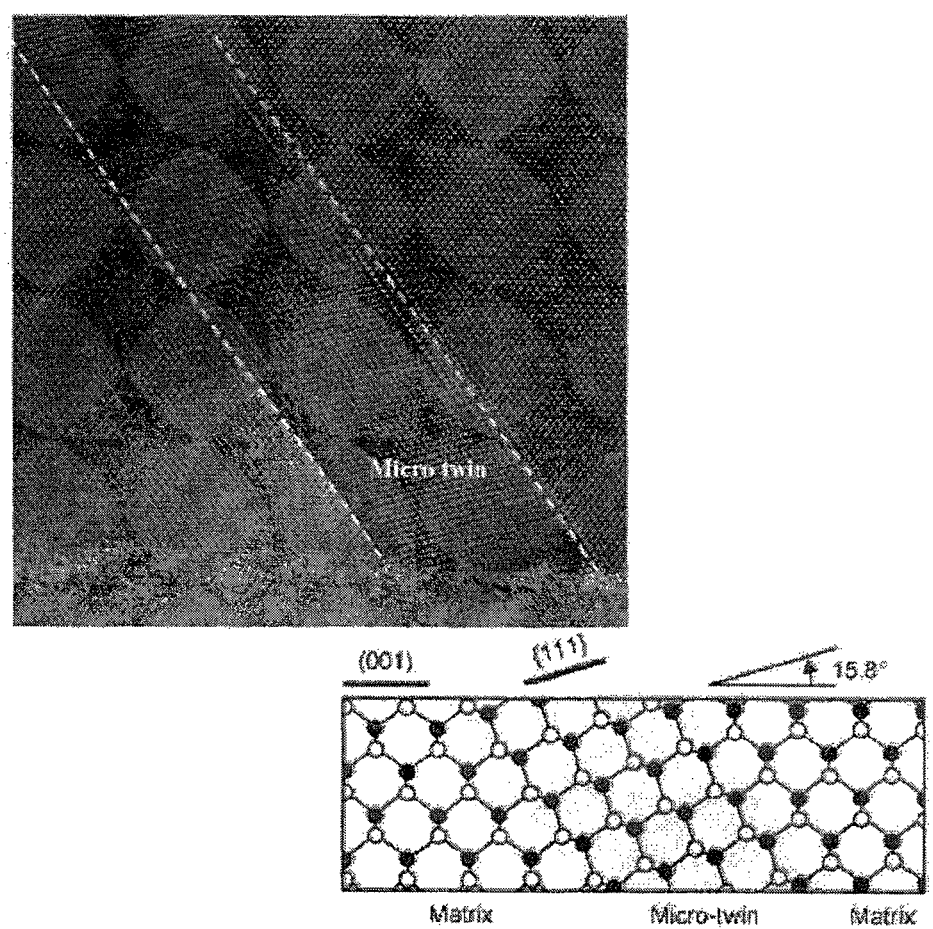
FIG. 8 shows a transmission electron microscopy (TEM) photograph and an atomic layout, showing a defect in a monocrystalline layer grown on a substrate having a lattice constant different from that of the monocrystalline layer.
Figure 9A:
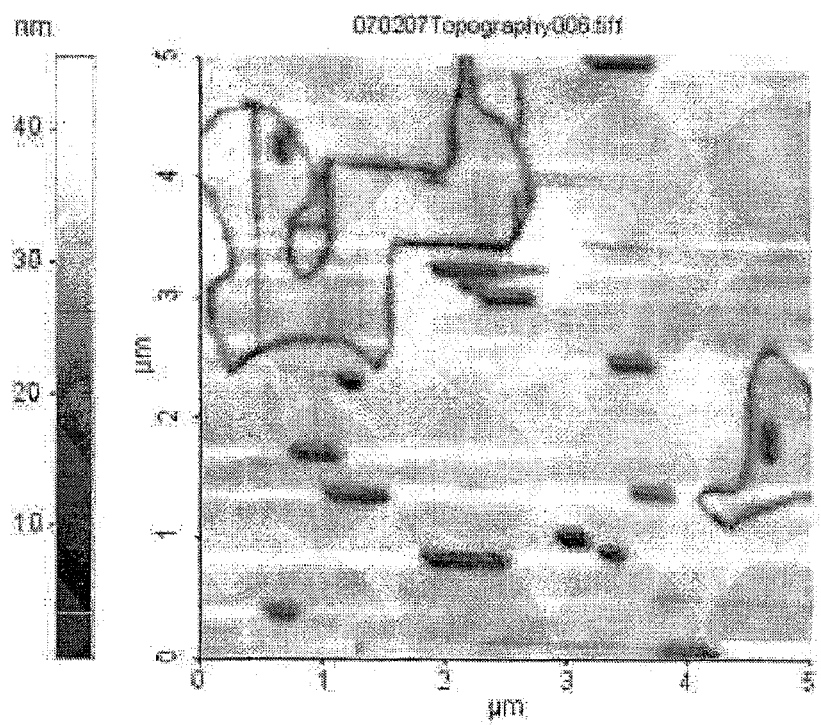
FIG. 9a is an atomic force microscopy (AFM) photograph showing a defect in a monocrystalline layer grown on a substrate having a lattice constant different from that of the monocrystalline layer.
Figure 9B:
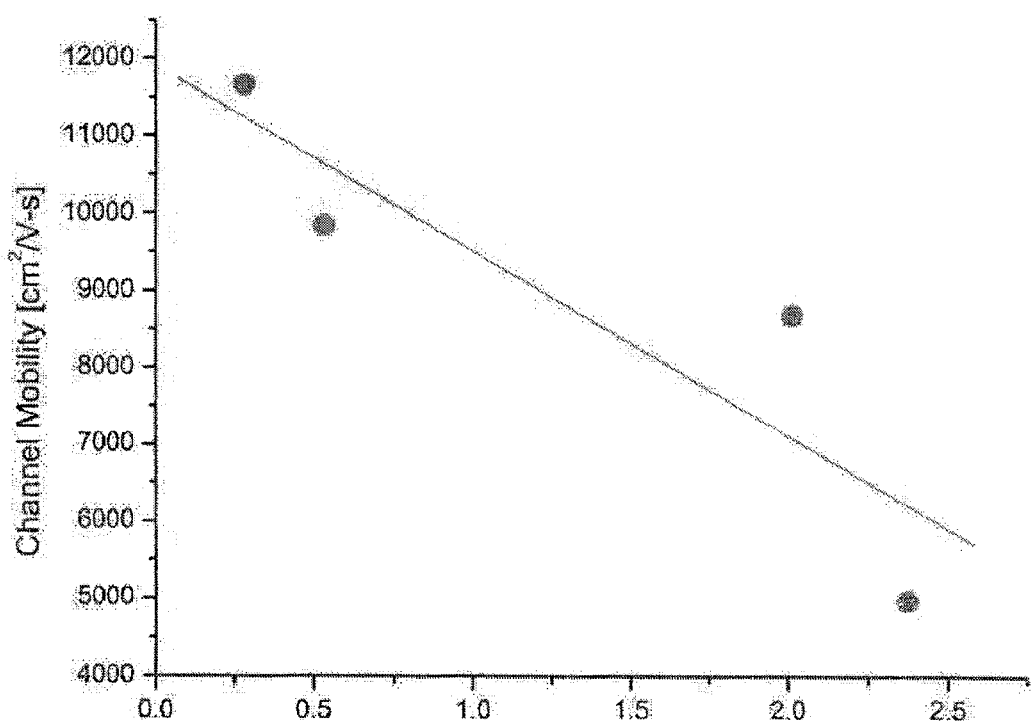
FIG. 9b is a graph showing characteristics of electron mobility depending on defect areas.

The lattice constants of the substrate 601 and the first epitaxial layer 602 are different from each other. Therefore, when the first epitaxial layer 602 is grown to a critical thickness or thicker, defects 603 such as dislocations or micro twins are produced in the first epitaxial layer 602 grown on the substrate 601. For example, if a first monocrystalline layer having a different lattice constant is grown on a substrate having a plane index of (001), a defect grown in a direction of {111} different from the crystal direction of the substrate, i.e., a micro twin, is produced as shown in FIG. 8. The drawing shown at an upper portion of FIG. 8 is a transmission electron microscopy (TEM) photograph showing a micro twin of a monocrystalline layer formed on a substrate, and the drawing shown at a lower portion of FIG. 8 is a view showing atomic arrangement extended from the TEM photograph. Referring to an atomic force microscopy (AFM) photograph of FIG. 9a, the area of defects can be obtained, and it can be seen that electron mobility is decreased as shown in FIG. 9b. As the growth thickness of the first epitaxial layer 602 is increased, a surface step is enlarged. Accordingly, it is recommended that the first epitaxial layer 602 is grown with a thickness of 100 μm or thinner, and the growth temperature of the first epitaxial layer 202 may be set as 200 to 1200° C.

Figure 10A:
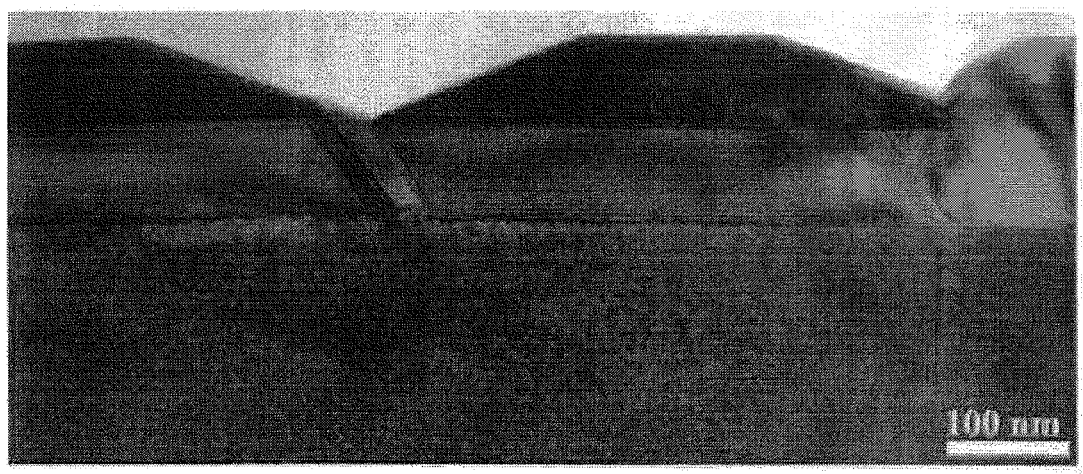
FIG. 10a is a TEM photograph showing the cross-section of a structure in which a second monocrystalline layer is grown on a first monocrystalline layer in which defects are not repaired.
Figure 10B:
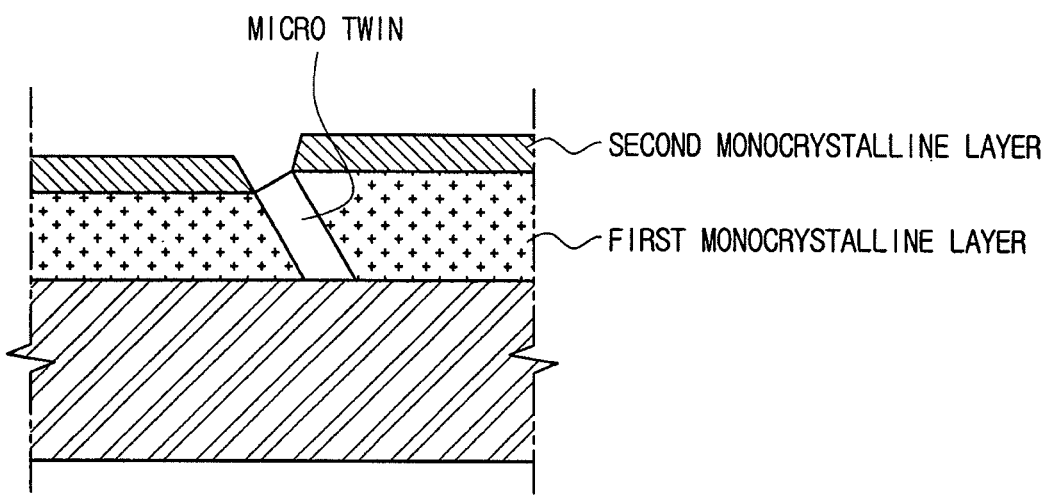
FIG. 10b is a reference diagram showing the second monocrystalline layer partially grown by the defect in the first monocrystalline layer.

Meanwhile, if a second monocrystalline layer is grown on the first monocrystalline layer using a material with a lattice constant similar to that of the first monocrystalline layer in the state that a defect such as a micro twin is produced as shown in FIG. 8, the second monocrystalline layer is not grown on a surface of the portion of the first monocrystalline layer where the defect is formed as shown in FIGS. 10a and 10b, even though the lattice constants of the first and second monocrystalline layers are similar to each other. This is because the lattice constant of the first monocrystalline layer having the defect formed therein is different from that of the normally grown first monocrystalline layer. Therefore, to prevent the defect in the first monocrystalline layer from being transferred to the second monocrystalline layer, it is required to allow the lattice constant of the entire surface of the first monocrystalline layer to be maintained uniformly.

This disclosure provides a method in which metal quantum dots are formed on the first epitaxial layer 602 so that the lattice constant of the entire surface of the first epitaxial layer 602 formed on the substrate 601 is maintained uniformly, the metal quantum dots 604 are respectively moved onto portions in which the defects 603 exist, and metal quantum-dot semiconductor crystals having a crystal structure similar to that of the first epitaxial layer 602 are then formed by allowing the metal quantum dots 604 to react with a reactant or with the first epitaxial layer so as to repair the corresponding defects 603, thereby allowing the entire surface of the first epitaxial layer 602 to have a uniform lattice constant.

Specifically, metal quantum dots 604 are first formed on the first epitaxial layer 602 (S502) [see (c) of FIG. 6]. A material used as the metal quantum dot 604 may have a lattice constant greater than that of the first epitaxial layer 602. The metal quantum dots 604 may be formed by vacuum evaporation or chemical vapor deposition (CVD). At this time, the formed metal quantum dots 604 are arranged on the first epitaxial layer 602 through self-assembly. The metal quantum dots 604 may have a size of about 0.1 nm to about 10 μm.

When the first epitaxial layer 602 is made of silicon (Si), a material used as the metal quantum dot 604 may be a metal that can participate in silicide reaction. When the first epitaxial layer 602 is made of a compound semiconductor, a group II or III cation of a material constituting the first epitaxial layer 602 may be used as the metal quantum dot 604.

Figure 7:
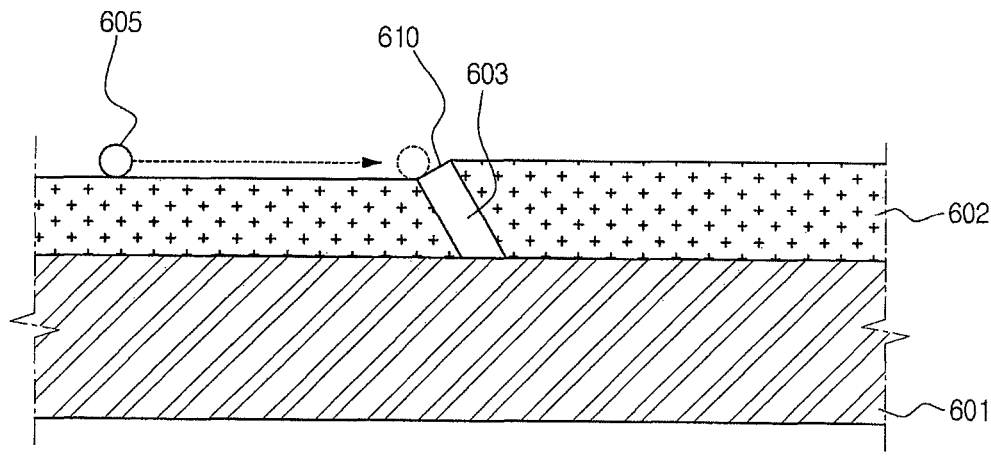
FIG. 7 is a reference diagram showing a quantum dot moved onto a step by surface energy according to the embodiment.

The surface (hereinafter, referred to as a step 610) of the first epitaxial layer 602 corresponding the portion in which the defects 603 exist has surface energy lower than that of the normally grown first epitaxial layer 602. Accordingly, the metal quantum dot 604 formed on the first epitaxial layer 602 is moved onto the step 610, which has relatively low surface energy (S503) (see FIG. 7). Accordingly, the defects in the first epitaxial layer 602 are primarily repaired.

In the state that the metal quantum dot 604 is moved onto the step 610, the metal quantum dot 604 is converted into a metal quantum-dot semiconductor crystal 605 (S504) [see (d) of FIG. 6]. In detail, the metal quantum-dot semiconductor crystal 605 may be formed by supplying a reactant, e.g., a group V or VI anion of a material constituting the first epitaxial layer 602, and then allowing the metal quantum dot 604 to react with the reactant. Alternatively, the metal quantum-dot semiconductor crystal 605 may be formed by allowing the metal quantum dot 604 to react with the first epitaxial layer 602 through thermal treatment. The produced metal quantum-dot semiconductor crystal 605 has a crystal structure similar to that of the first epitaxial layer 602, i.e., lattice constant or lattice structure similar to that of the first epitaxial layer 602, and the defects on the first epitaxial layer 602 are repaired. Accordingly, the entire surface of the first epitaxial layer 602 has a uniform lattice constant.

As described above, in the method for epitaxial growth, a first epitaxial layer is grown on a substrate, and quantum dots and metal quantum-dot semiconductor crystals are formed on the first epitaxial layer. However, when defects exist in the substrate, i.e., when the substrate is a polycrystalline substrate, quantum dots and metal quantum-dot semiconductor crystals may be sequentially formed on the polycrystalline substrate.

Meanwhile, in the state that the defects in the first epitaxial layer 602 are repaired by the metal quantum-dot semiconductor crystals 605, i.e., in the state that the entire surface of the first epitaxial layer 202 has a uniform lattice constant, a second epitaxial layer 606 having a lattice constant equal or similar to that of the first epitaxial layer 602 is grown on the first epitaxial layer 602 (S505) [see (e) of FIG. 6]. At this time, the defect in the first epitaxial layer 602 is prevented from being transferred by the metal quantum dot 604 mounted on the step 610. Accordingly, the second epitaxial layer 606 is epitaxially grown in the state that the defects are minimized. For reference, the second epitaxial layer 606 may be made of a binary compound semiconductor including any one of GaAs, AlAs, InAs, GaSb, AlSb, InSb, GaN, AlN, InN, GaP, AlP, InP, ZnO and MgO, a tertiary compound semiconductor or a quaternary compound semiconductor. Alternatively, the second epitaxial layer 606 may be formed into a structure in which at least two of the tertiary or quaternary compound semiconductors are stacked. The first and second epitaxial layers 602 and 606 may be made of different materials. In this case, to minimize defects in the second epitaxial layer 606, the mismatch of lattice constants between the first and second epitaxial layers 602 and 606 may be limited to within 10%.

A series of unit processes including growth of a first epitaxial layer, formation of metal quantum dots, formation of metal quantum-dot semiconductor crystals and growth of a second epitaxial layer may be repeatedly performed to minimize a concentration of defects in the first and second epitaxial layers.

As described above, the stacked structure of epitaxial layers fabricated according to the embodiment may be applied, for example, to semiconductor devices. Such semiconductor devices may be applied to circuits, systems, and the like. Further, the aforementioned stacked structure of epitaxial layers may be formed on a lower surface of a substrate as well as on an upper surface of the substrate. Such a stacked structure may be applied to semiconductor devices, circuits, and systems.

A method for epitaxial growth and an epitaxial layer structure using the method disclosed herein provides the following advantageous effect.

Metal quantum-dot semiconductor crystals respectively formed on defects of a substrate or epitaxial layer have a crystal structure corresponding to that of the substrate or epitaxial layer, thereby preventing defects on the substrate or epitaxial layer from being transferred to an epitaxial layer grown through a subsequent process.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. A method for epitaxial growth, comprising:
preparing a first epitaxial layer having a defect formed therein;
forming a metal quantum dot on the first epitaxial layer;
allowing the metal quantum dot to be moved onto a step of the first epitaxial layer due to a difference of surface energy;
supplying a reactant to allow the metal quantum dot to react with the reactant to convert the metal quantum dot into a metal quantum-dot semiconductor crystal having a lattice constant corresponding to that of the first epitaxial layer; and
growing a second epitaxial layer on the first epitaxial layer.

2. A method for epitaxial growth, comprising:
preparing a first epitaxial layer having a defect formed therein;
forming a metal quantum dot on the first epitaxial layer;
allowing the metal quantum dot to be moved onto a step of the first epitaxial layer due to a difference of surface energy;
applying thermal treatment to the metal quantum dot to convert the metal quantum dot into a metal quantum-dot semiconductor crystal having a lattice constant corresponding to that of the first epitaxial layer; and
growing a second epitaxial layer on the first epitaxial layer.

3. The method according to claim 1, wherein the reactant is a group V or VI anion of a material constituting the first epitaxial layer.

4. The method according to claim 3, wherein the second epitaxial layer has a lattice constant corresponding to that of the first epitaxial layer.

5. The method according to claim 1, wherein the mismatch of lattice constants between the first and second epitaxial layers is within 10%.

6. The method according to claim 1, wherein the metal quantum dot has a size of 0.1 nm to 10 μm.

7. The method according to claim 1, wherein the step of forming a metal quantum dot on the first epitaxial layer through the step of growing a second epitaxial layer on the first epitaxial layer are repeated plural times.

8. The method according to claim 1, wherein the first epitaxial layer is a substrate, and the substrate is any one of a silicon monocrystalline substrate, a silicon polycrystalline substrate, a germanium monocrystalline substrate, a GaAs monocrystalline substrate, an InAs monocrystalline substrate, a GaN monocrystalline substrate and a sapphire monocrystalline substrate.

9. The method according to claim 1, wherein the first epitaxial layer is made of a binary compound semiconductor including any one of GaAs, AlAs, InAs, GaSb, AlSb, InSb, GaN, AlN, InN, GaP, AlP, InP, ZnO and MgO, a tertiary compound semiconductor or a quaternary compound semiconductor, or is formed into a structure in which at least two of the tertiary or quaternary compound semiconductors are stacked.

10. The method according to claim 1, wherein the second epitaxial layer is made of a binary compound semiconductor including any one of GaAs, AlAs, InAs, GaSb, AlSb, InSb, GaN, AlN, InN, GaP, AlP, InP, ZnO and MgO, a tertiary compound semiconductor or a quaternary compound semiconductor, or is formed into a structure in which at least two of the tertiary or quaternary compound semiconductors are stacked.

11. The method according to claim 2, wherein the metal quantum dot is converted into the metal quantum-dot semiconductor crystal by allowing the metal quantum dot to react with the first epitaxial layer.

* * * * *